United States Patent [19]
Selyutin et al.

[11] Patent Number: 6,120,609
[45] Date of Patent: Sep. 19, 2000

[54] SELF-ALIGNING LIFT MECHANISM

[75] Inventors: Leonid Selyutin, San Leandro; Talex Sajoto, San Jose; Jun Zhao, Cupertino, all of Calif.

[73] Assignee: Applied Materials, Inc., Santa Clara, Calif.

[21] Appl. No.: 08/892,612

[22] Filed: Jul. 14, 1997

Related U.S. Application Data

[63] Continuation-in-part of application No. 08/738,240, Oct. 25, 1996.

[51] Int. Cl.[7] .................................................. C23C 16/00
[52] U.S. Cl. ......................... 118/728; 118/729; 118/500; 156/345
[58] Field of Search ................................. 118/728, 729, 118/500; 156/345

[56] References Cited

U.S. PATENT DOCUMENTS

| | | | |
|---|---|---|---|
| 5,458,688 | 10/1995 | Watanabe | 118/724 |
| 5,558,717 | 9/1996 | Zhao et al. | 118/715 |
| 5,695,568 | 12/1997 | Sinha et al. | 118/729 |
| 5,772,773 | 6/1998 | Wytman | 118/729 |

*Primary Examiner*—Shrive Beck
*Assistant Examiner*—Norca L. Torres
*Attorney, Agent, or Firm*—Peters, Verny, Jones & Biksa

[57] ABSTRACT

An improved lift mechanism includes a configuration having two sections of bellows welded to a central flange. The central flange provides support for a precisely aligned lift pin support structure. The efficient utilization of space provides space for an enlarged stem while minimizing the interaction between pieces within the processing chamber. Outside the vacuum limits of the processing chamber, a catch arrangement is provided as part of a linkage that allows a single vertical drive to be utilized to manipulate both the vertical motion of lift pins and vertical motion of the pedestal supporting a substrate in a processing chamber. In one configuration a unitized lift mechanism can be replaced as a unit. Particular orientations for utilizing a lift pin support plate with ceramic inserts is disclosed to reduce particle generation within the processing chamber.

10 Claims, 21 Drawing Sheets

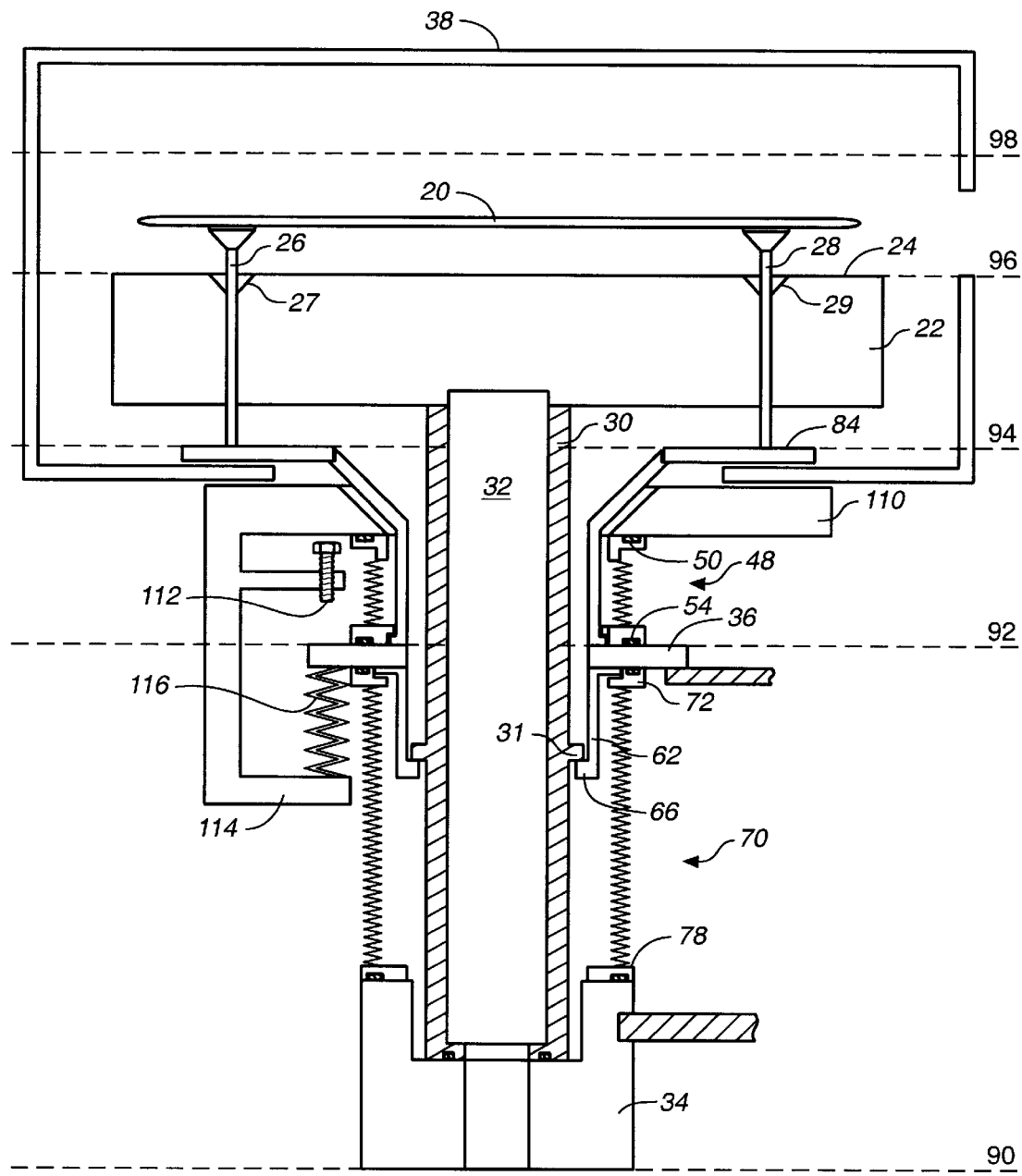
FIG._1

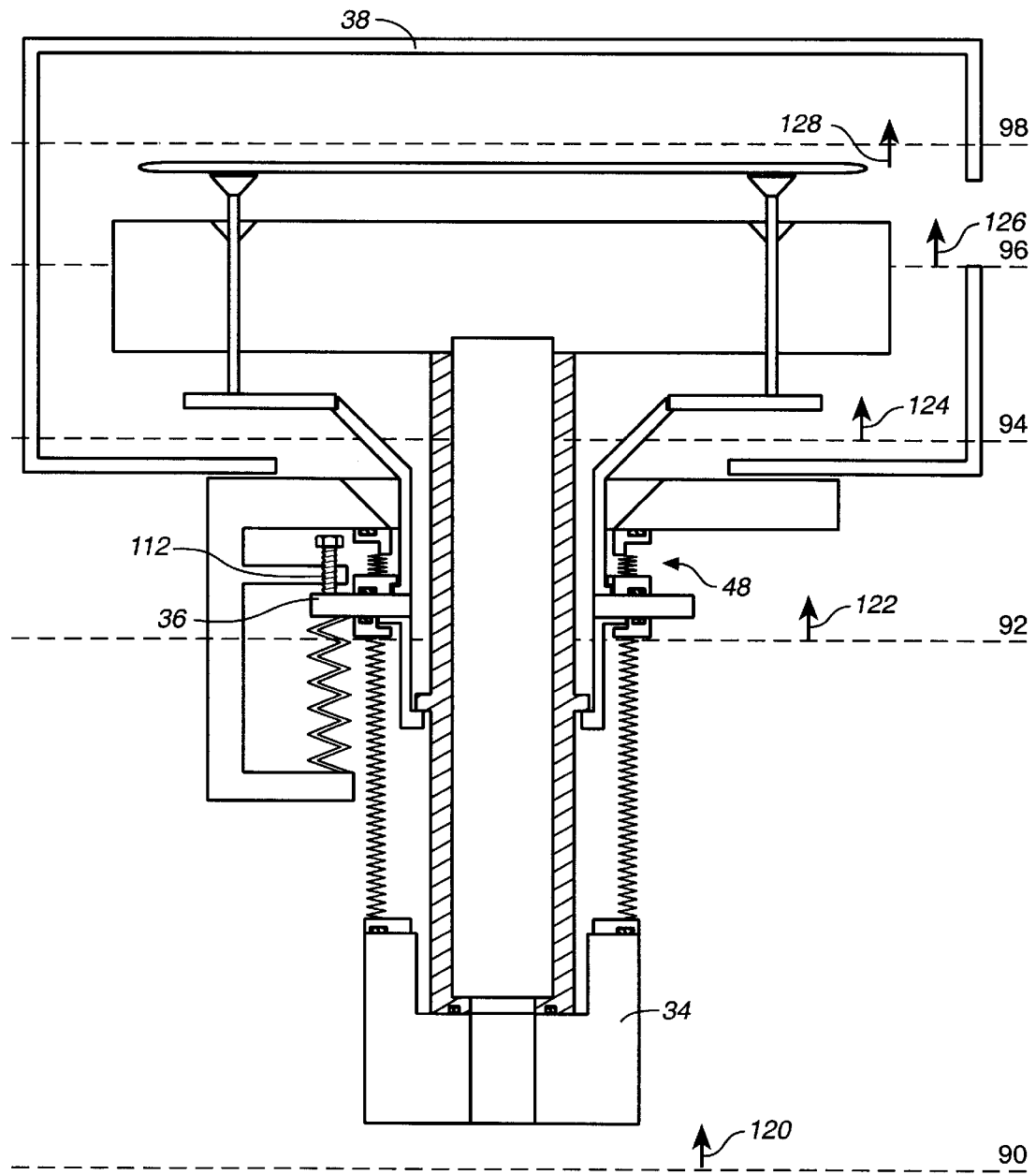
FIG._2

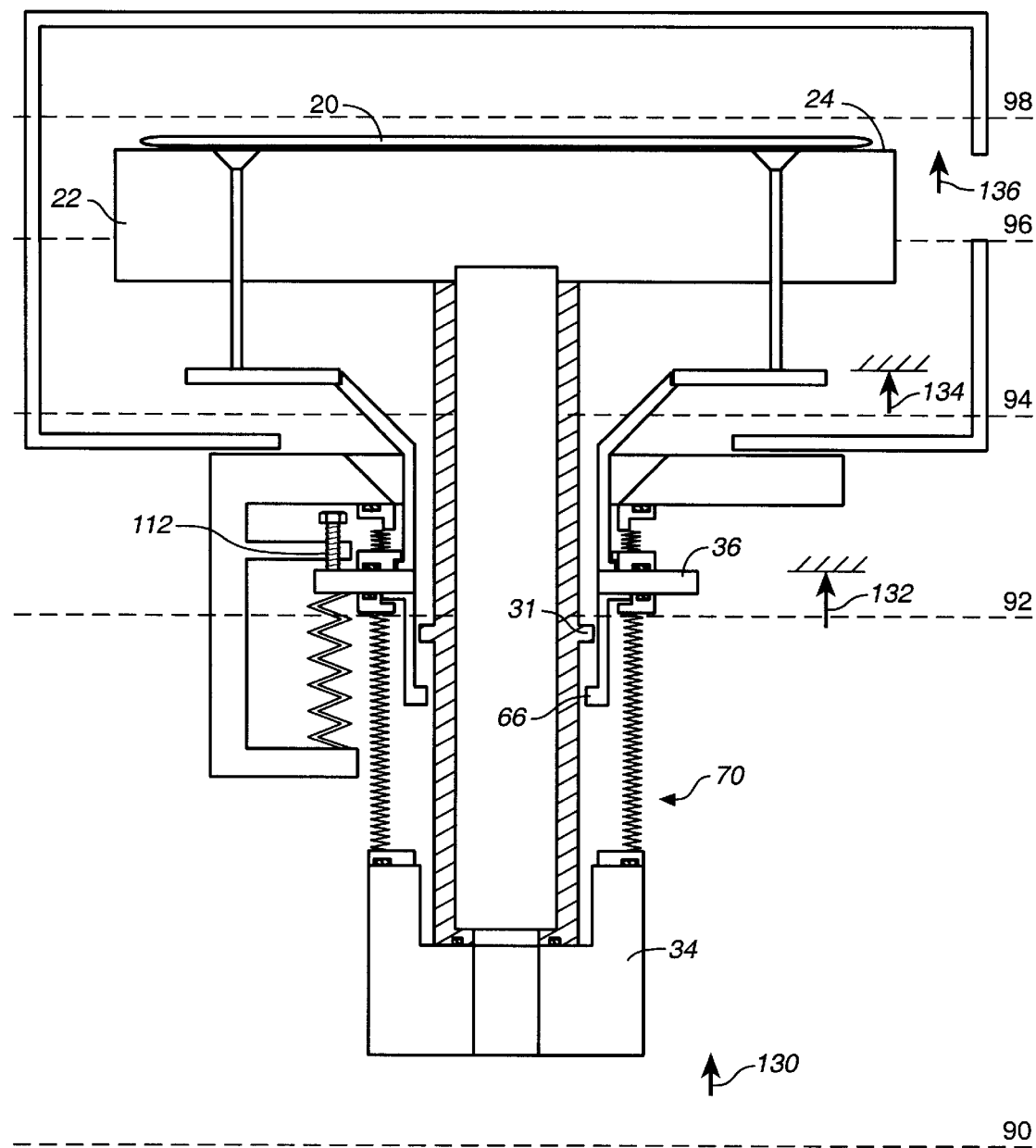
FIG._3

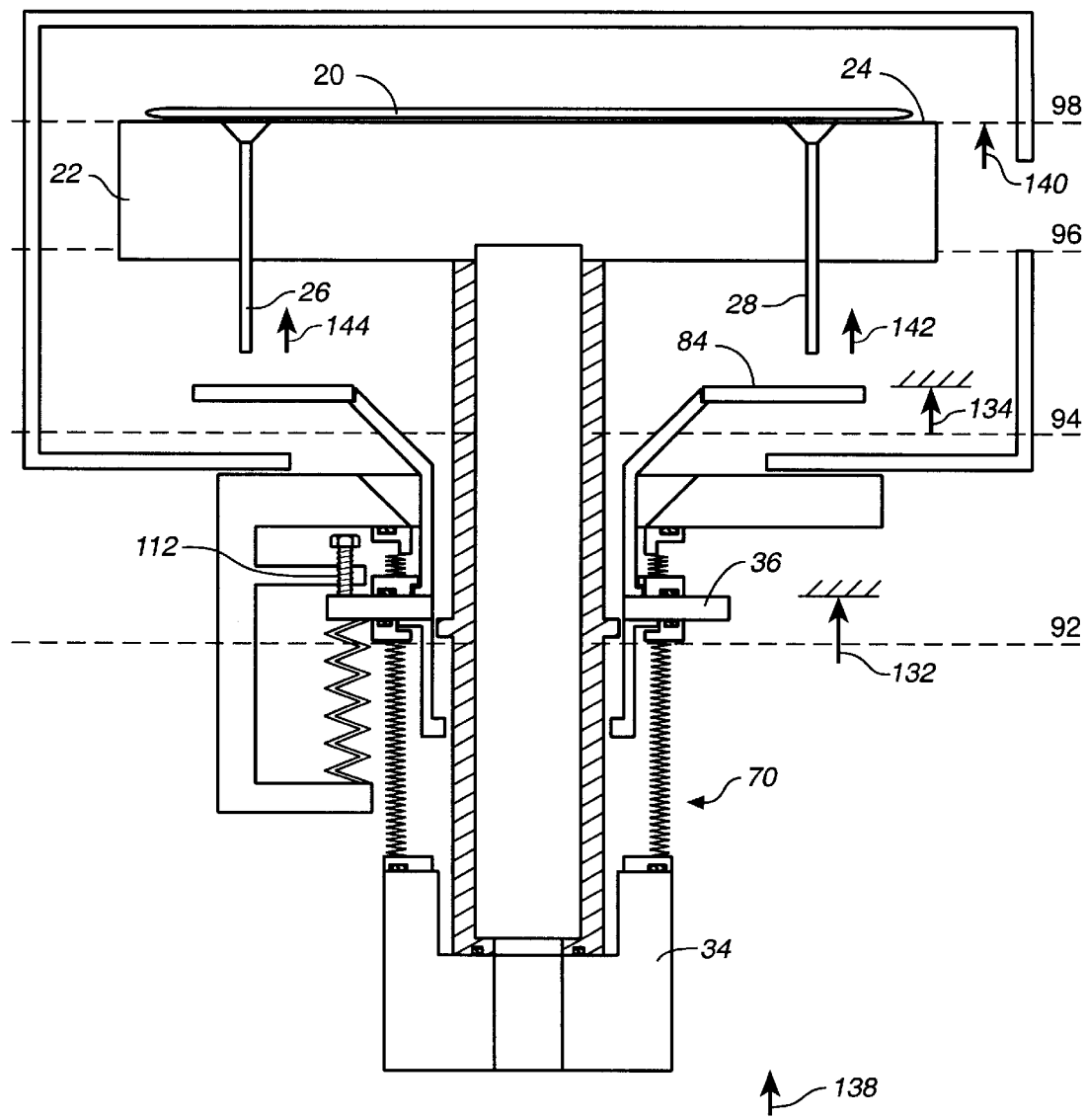
FIG._4

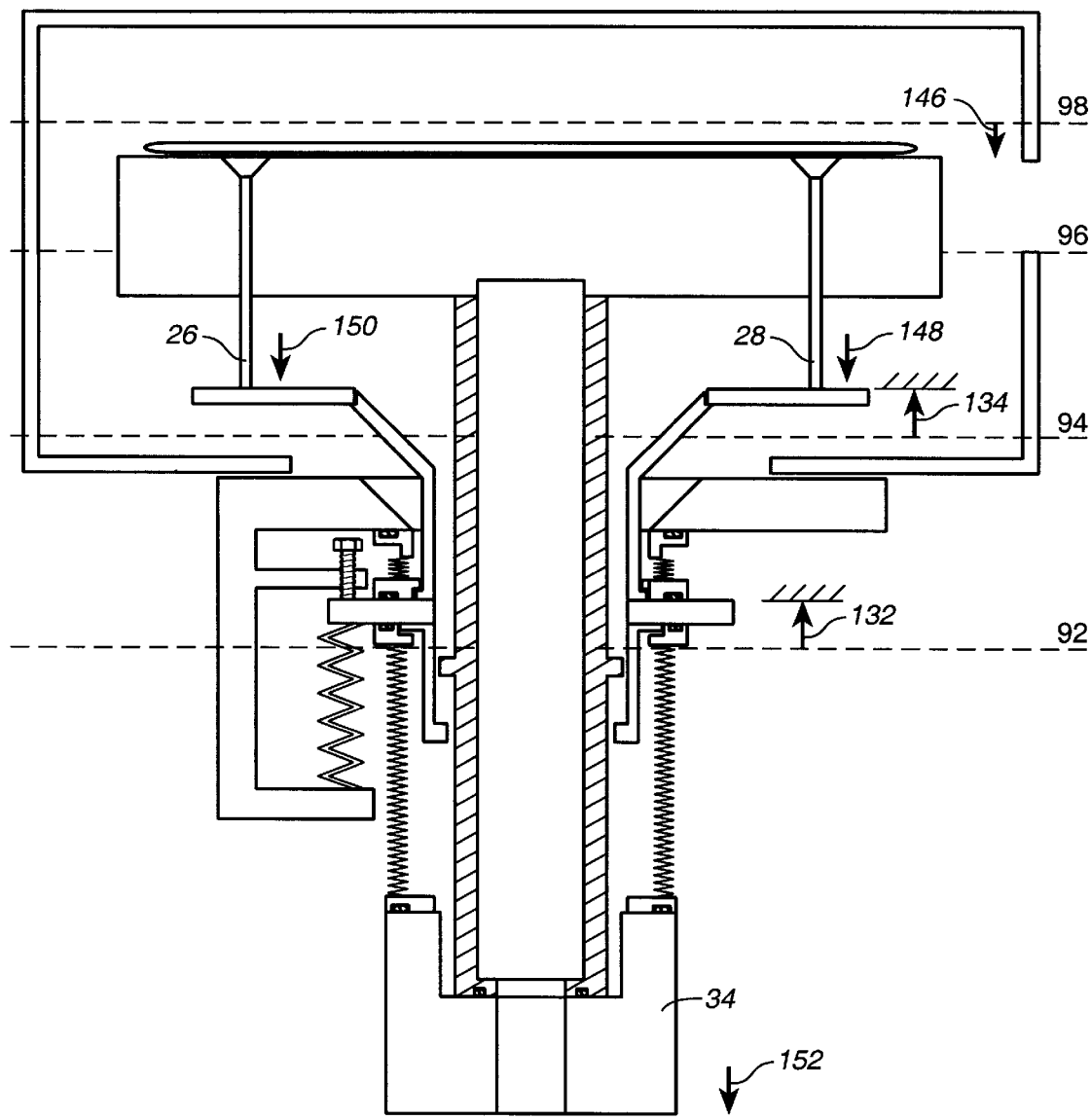
FIG._5

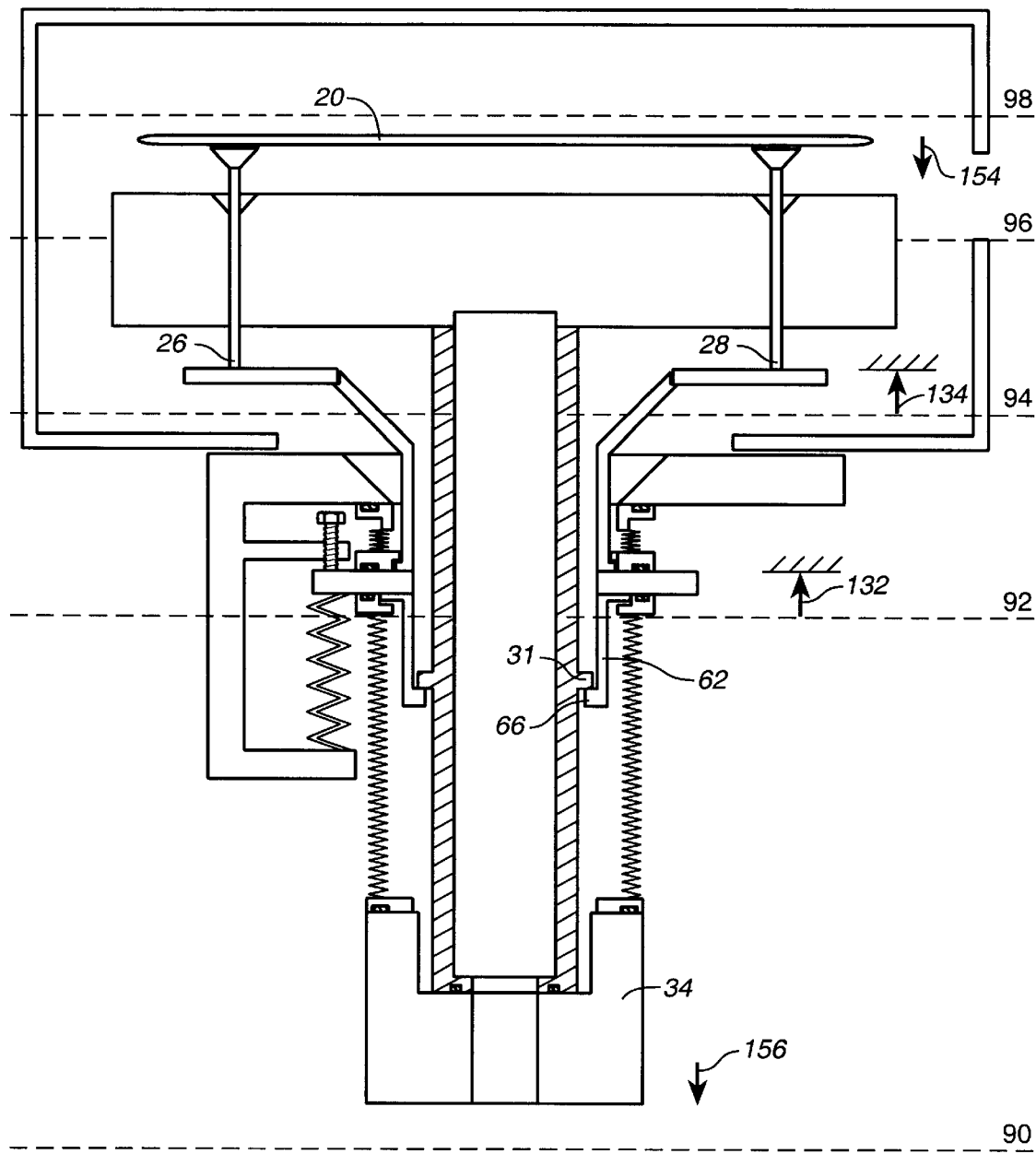
FIG._6

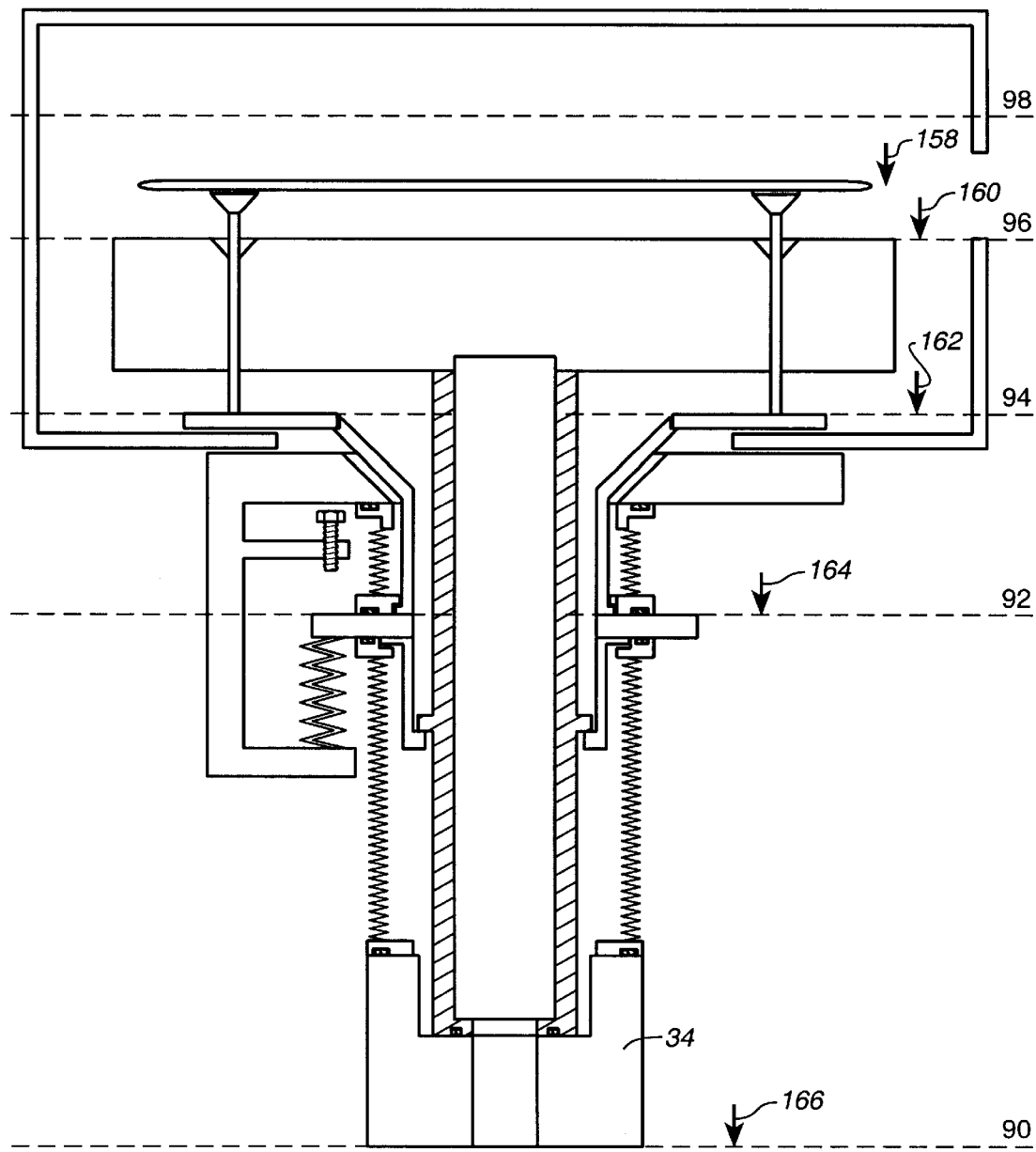
FIG._7

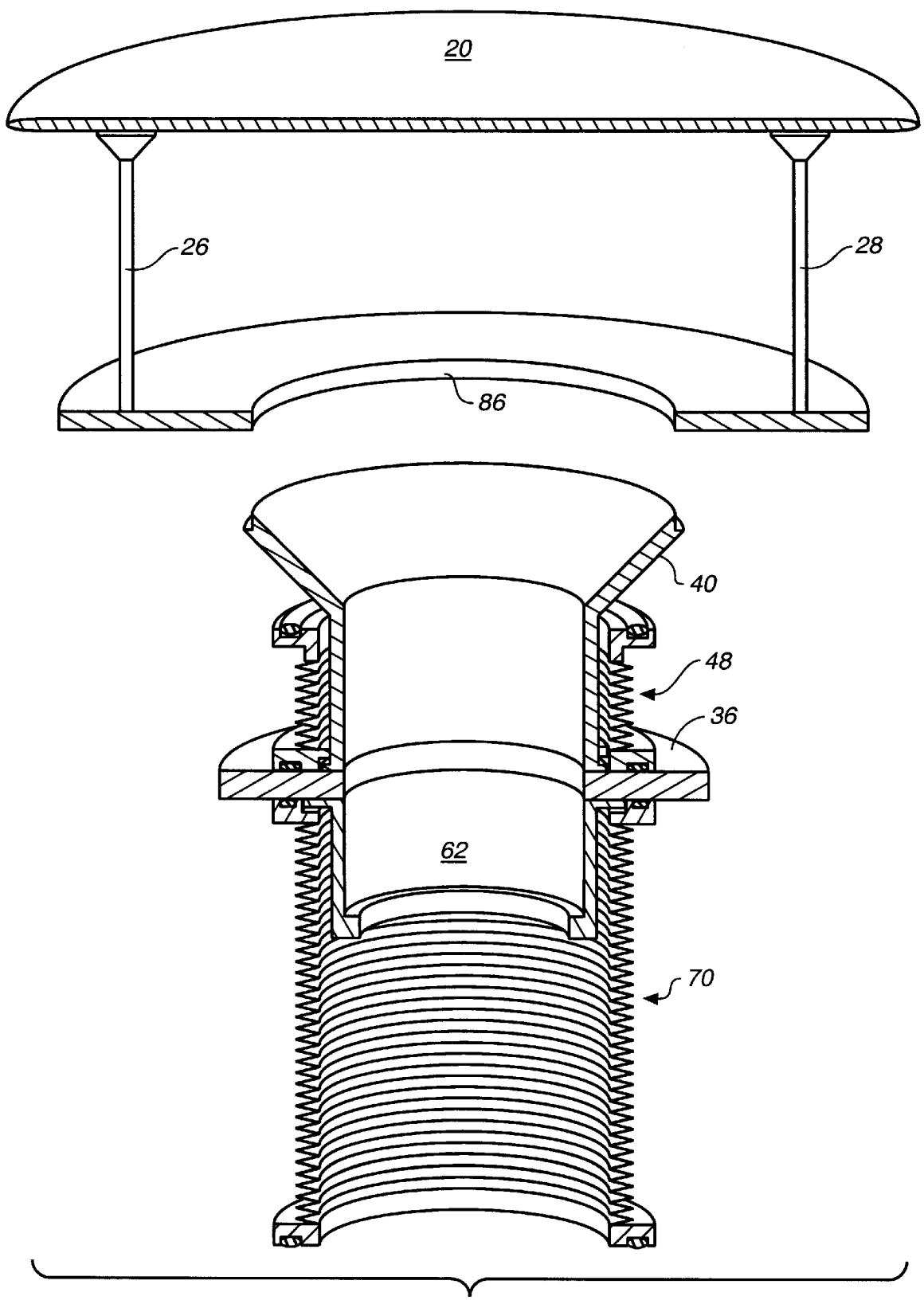
FIG._8

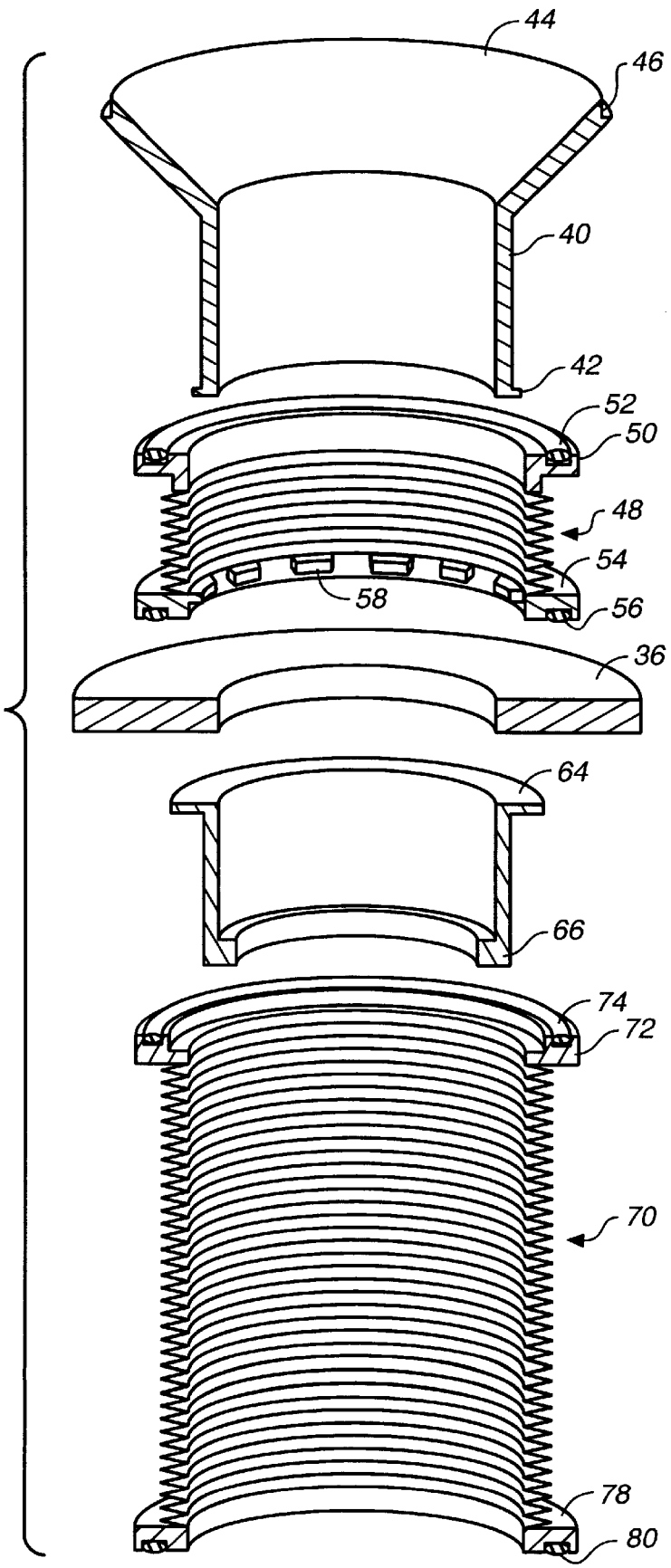
FIG._9

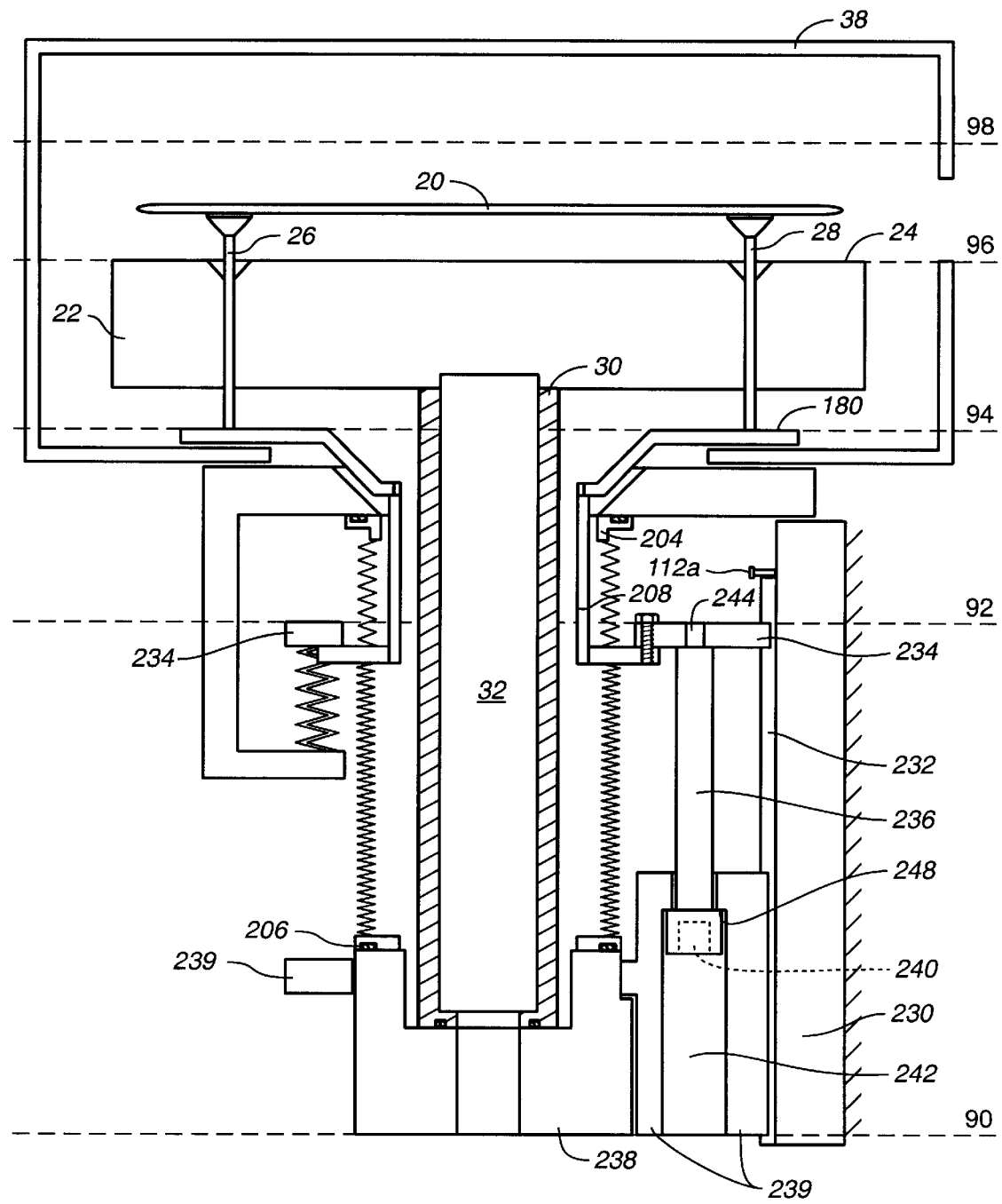
FIG._10

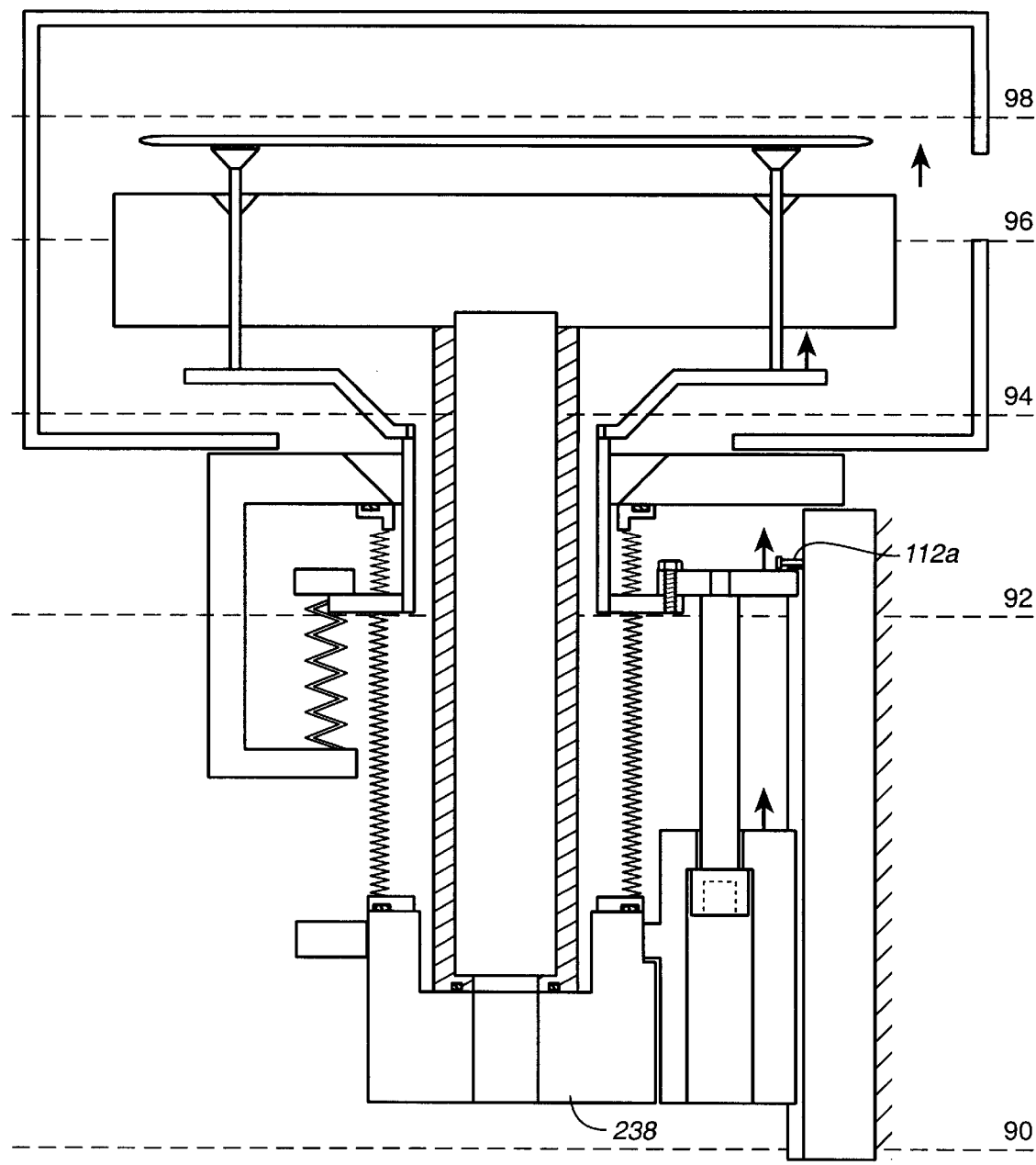
FIG._11

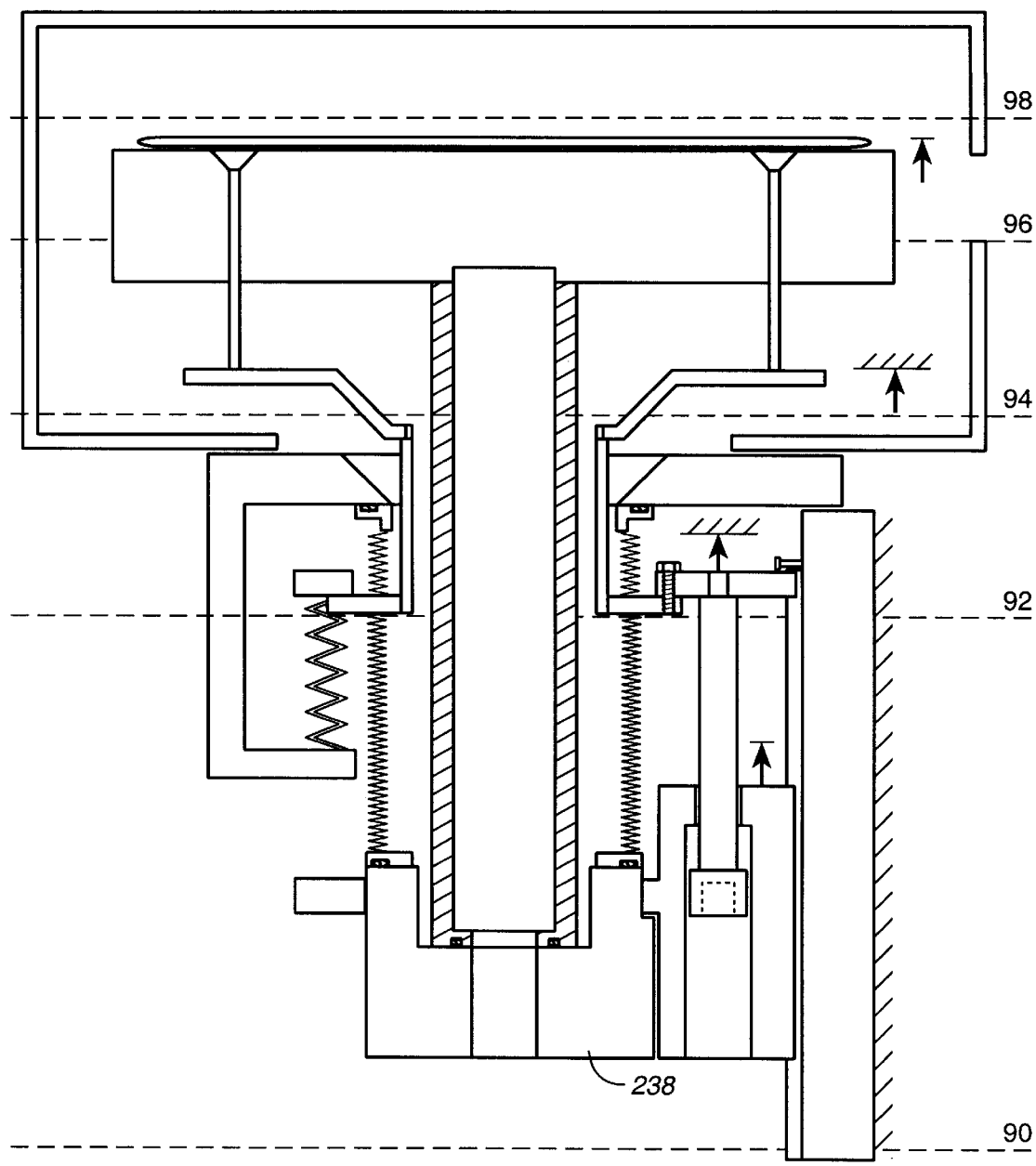
FIG._12

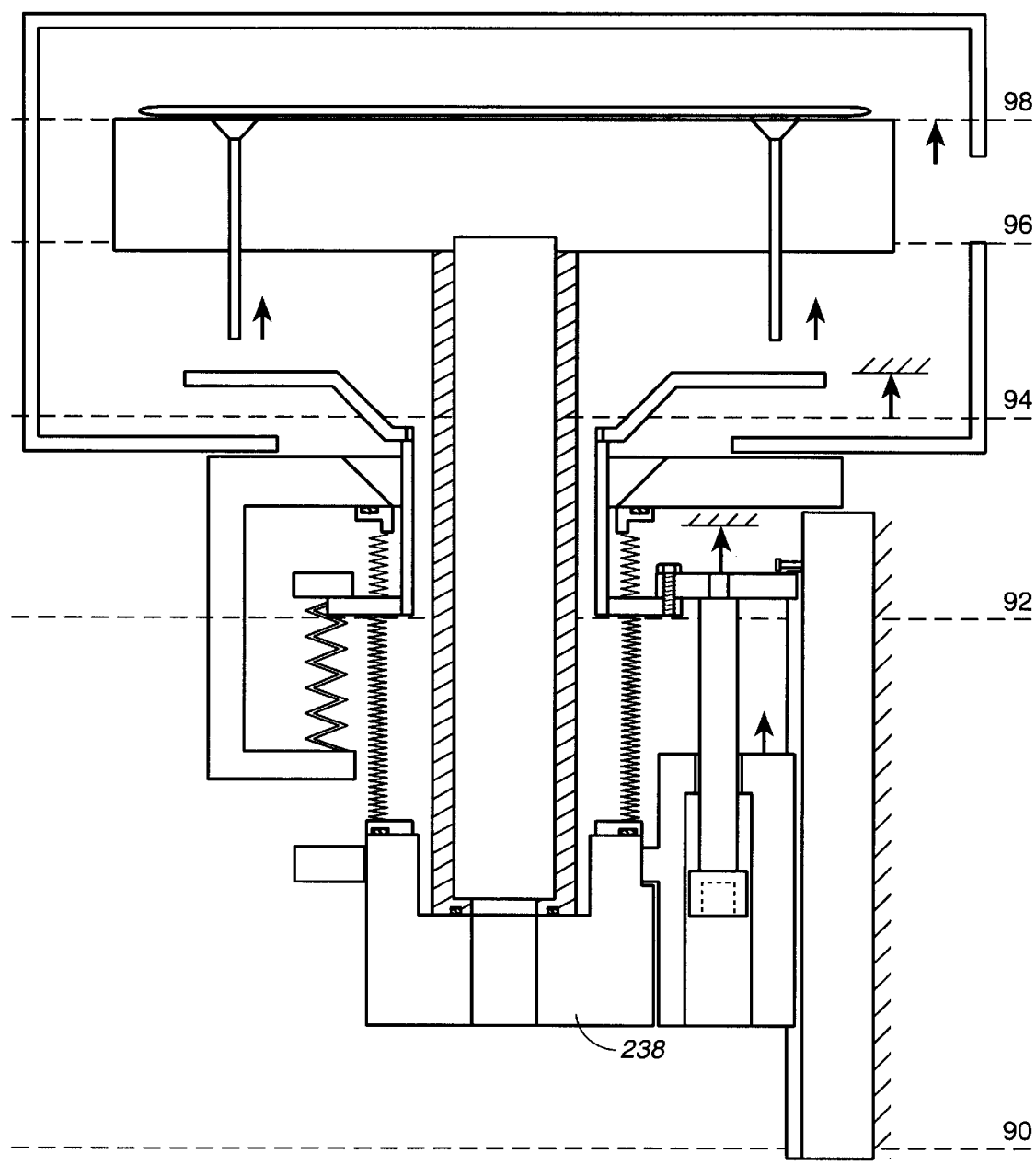
FIG._13

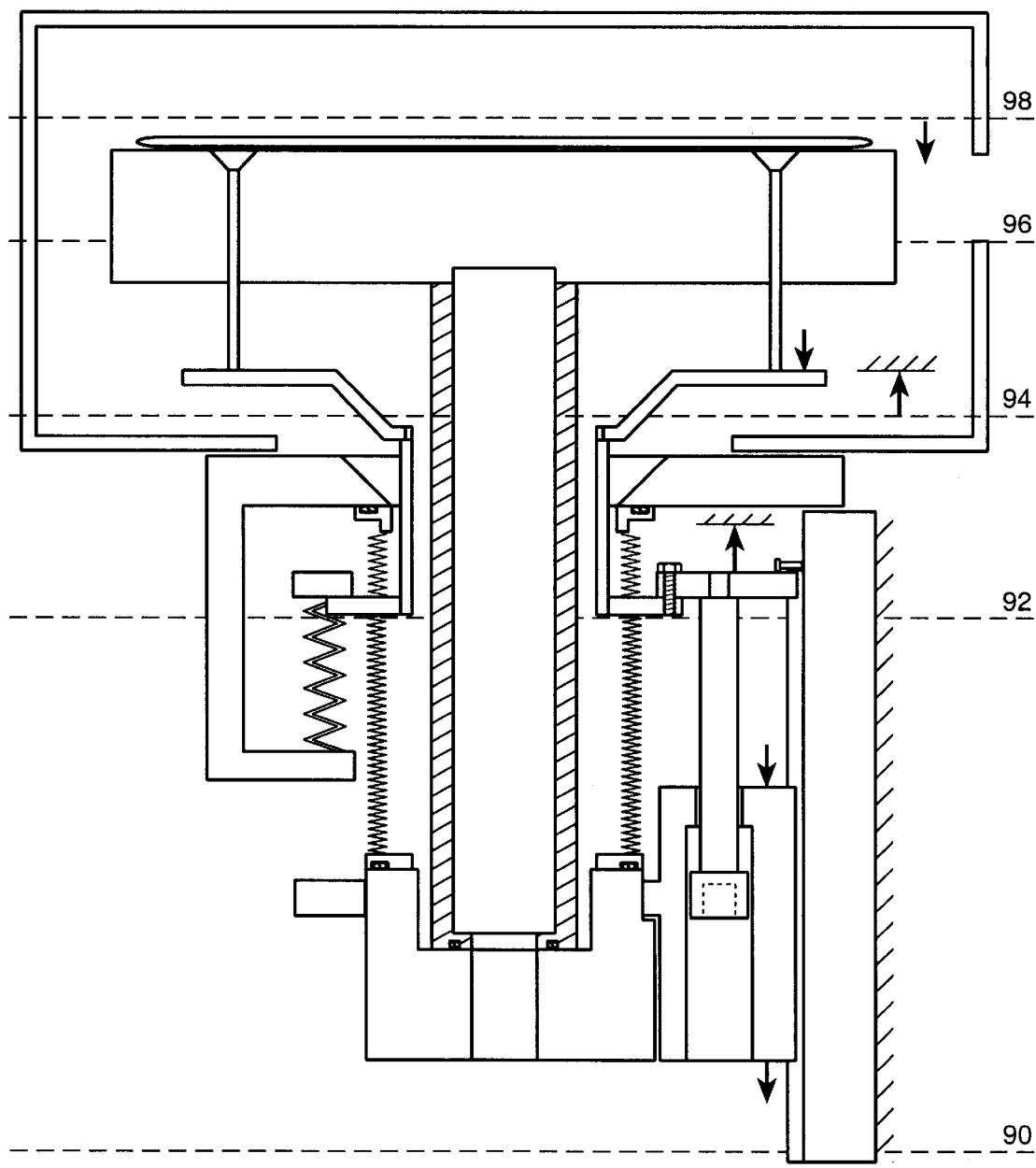
FIG._14

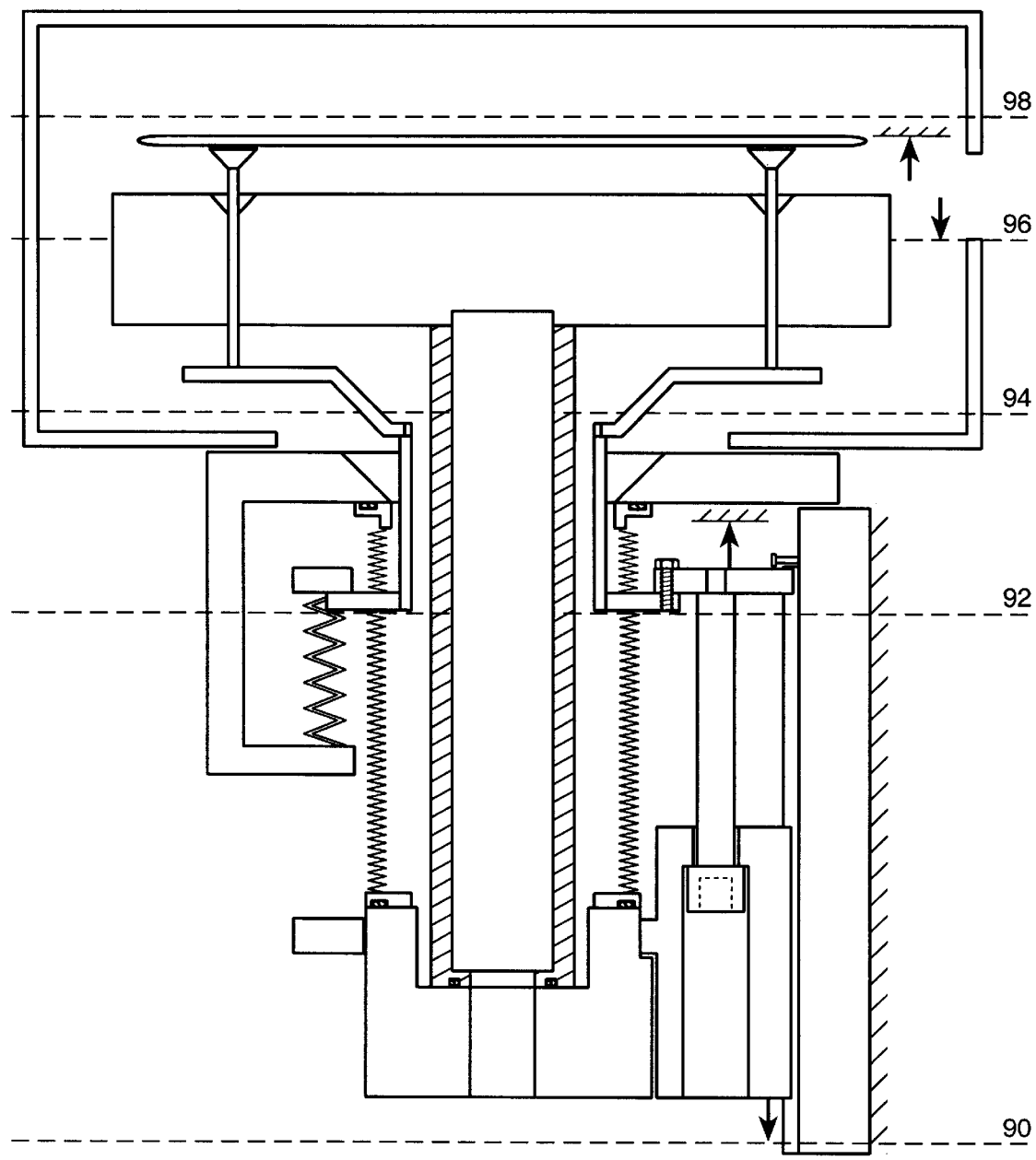
FIG._15

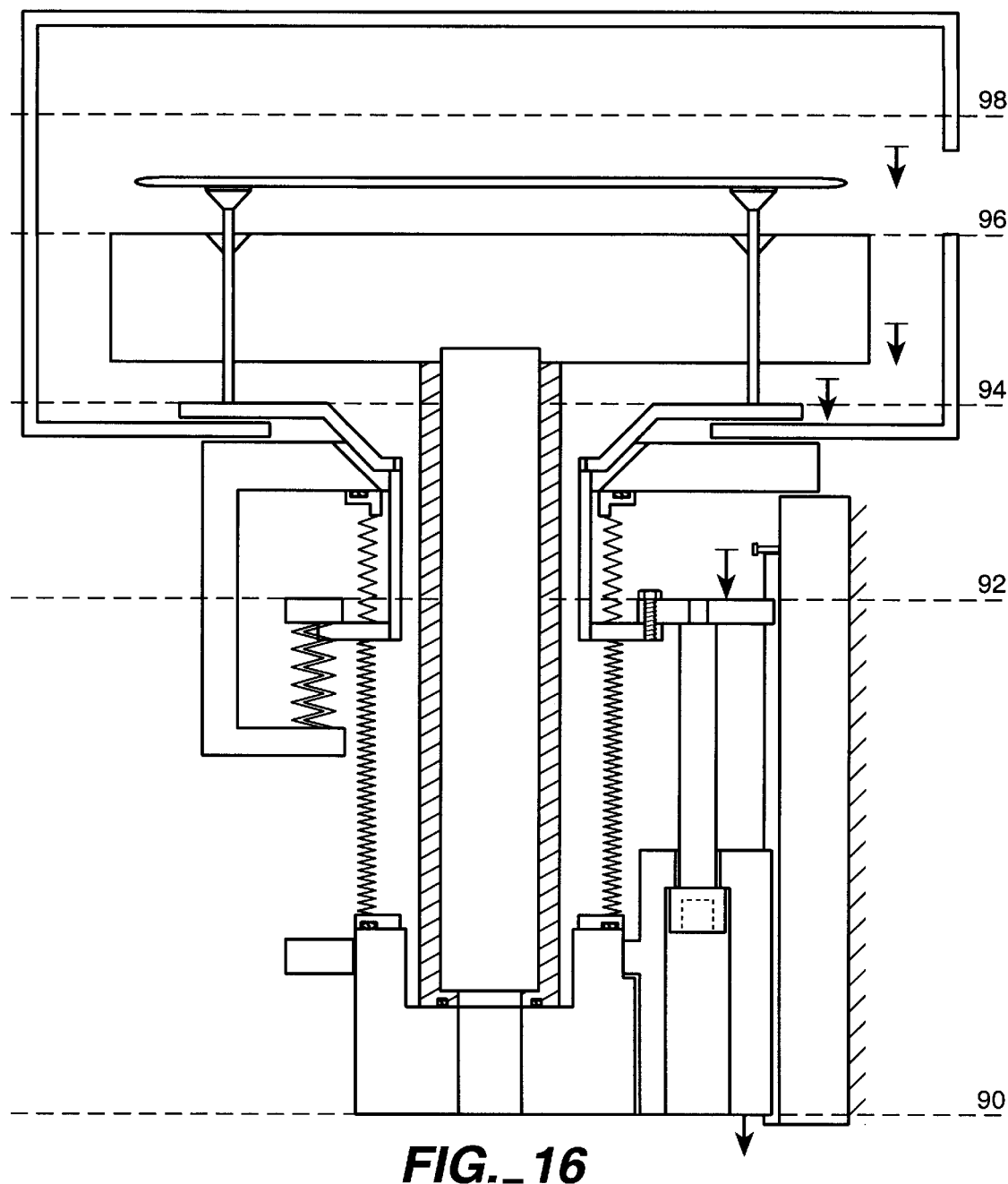
FIG._16

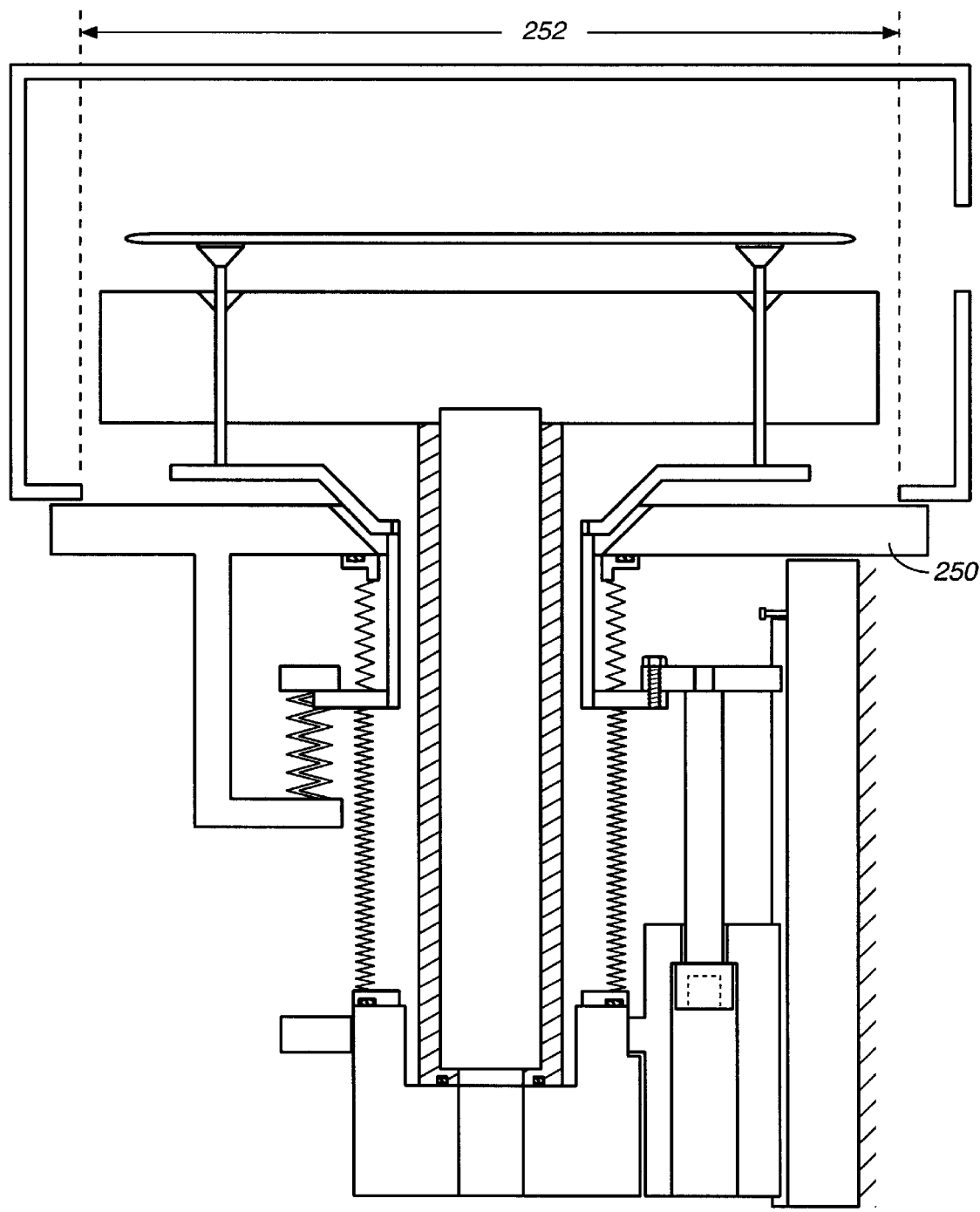
FIG._17

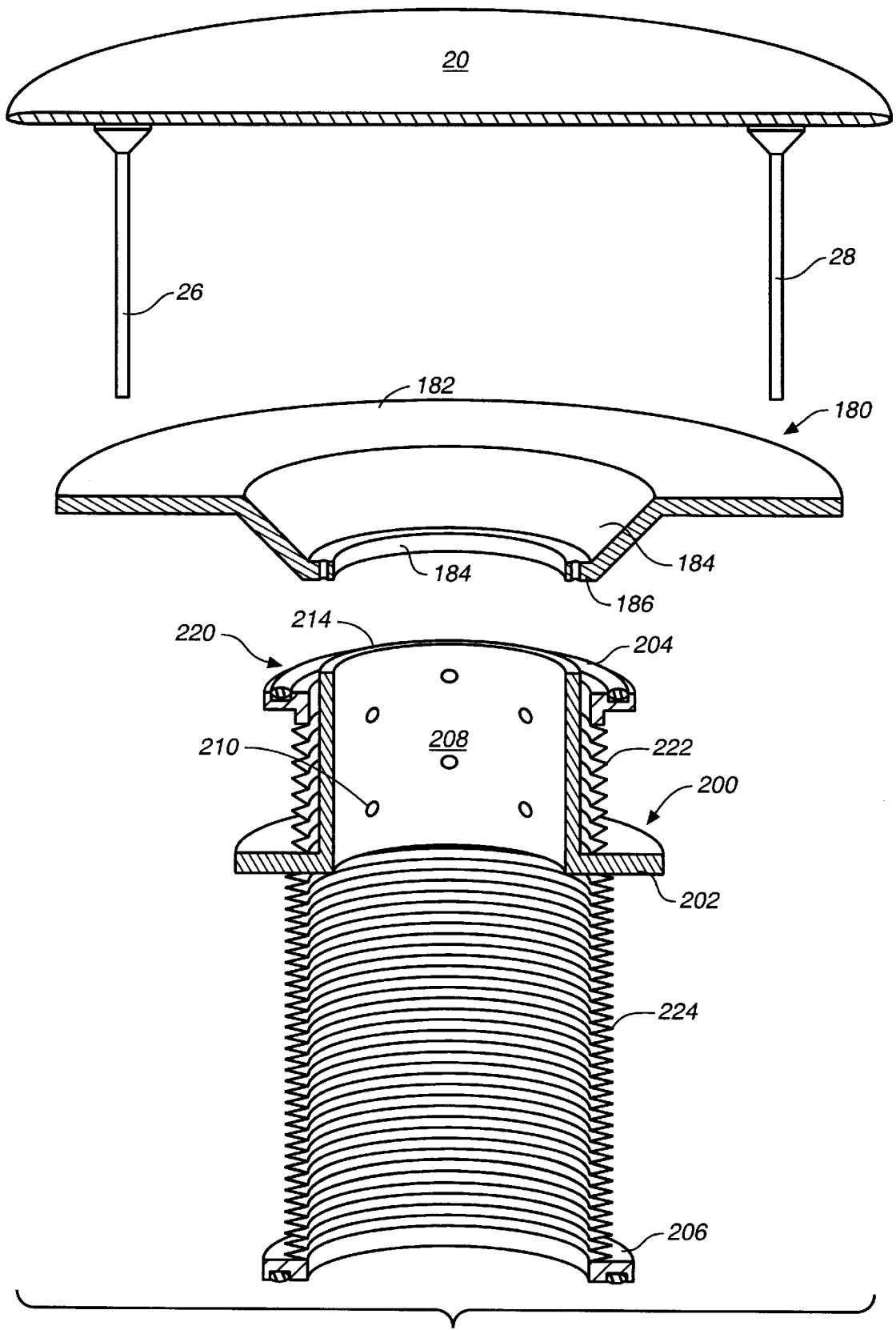
FIG._18

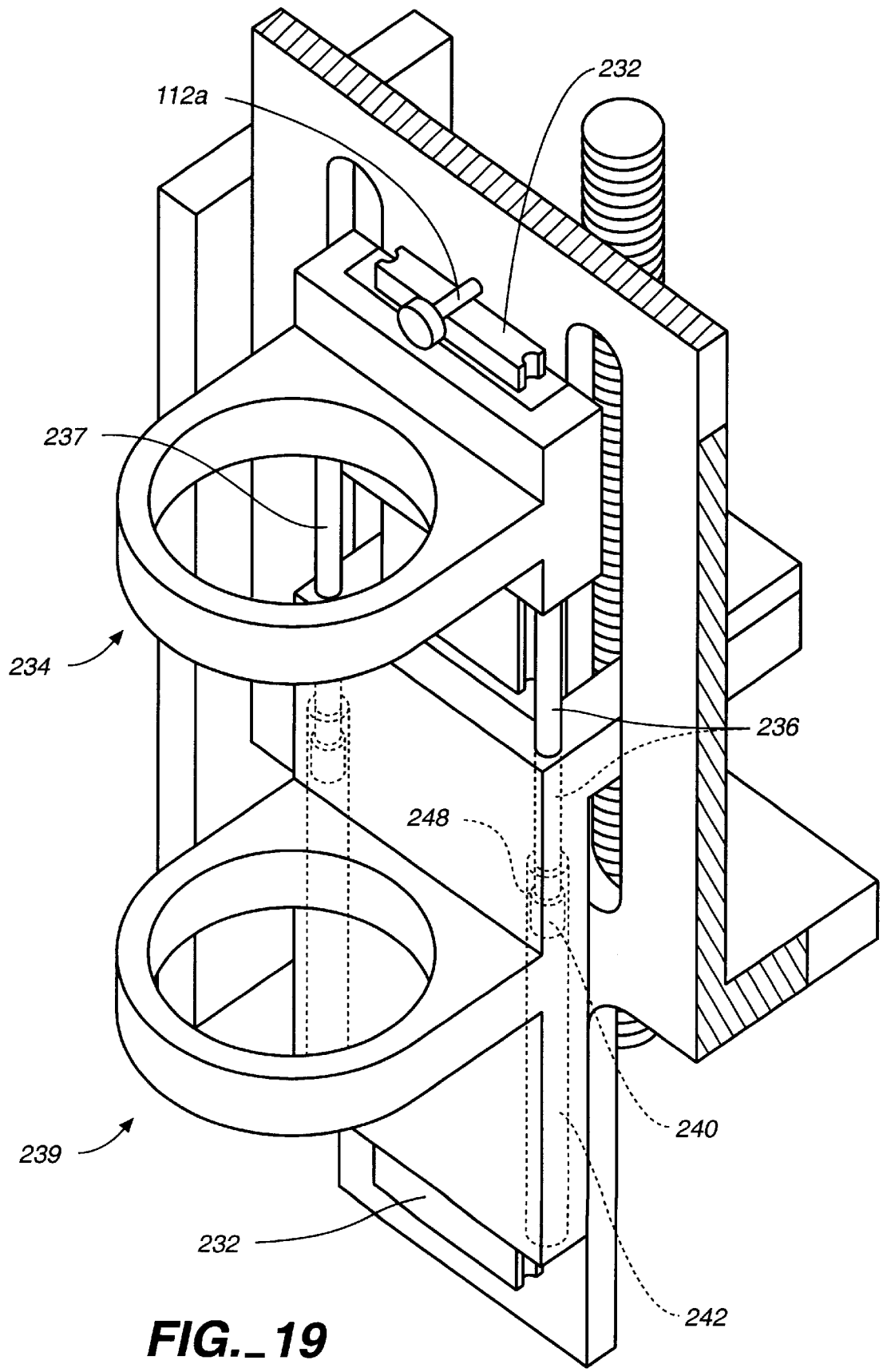
FIG._19

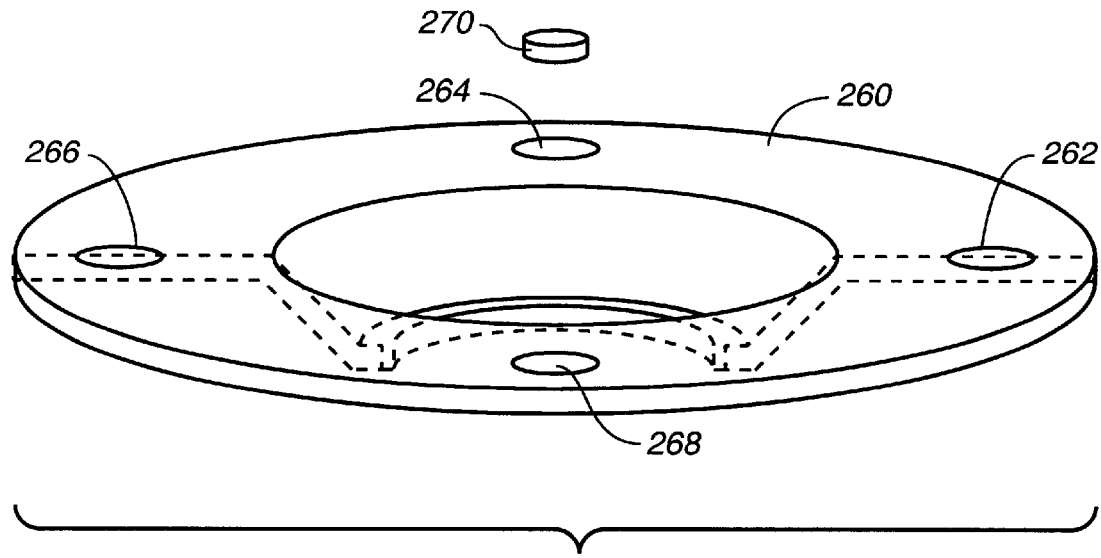
FIG._20
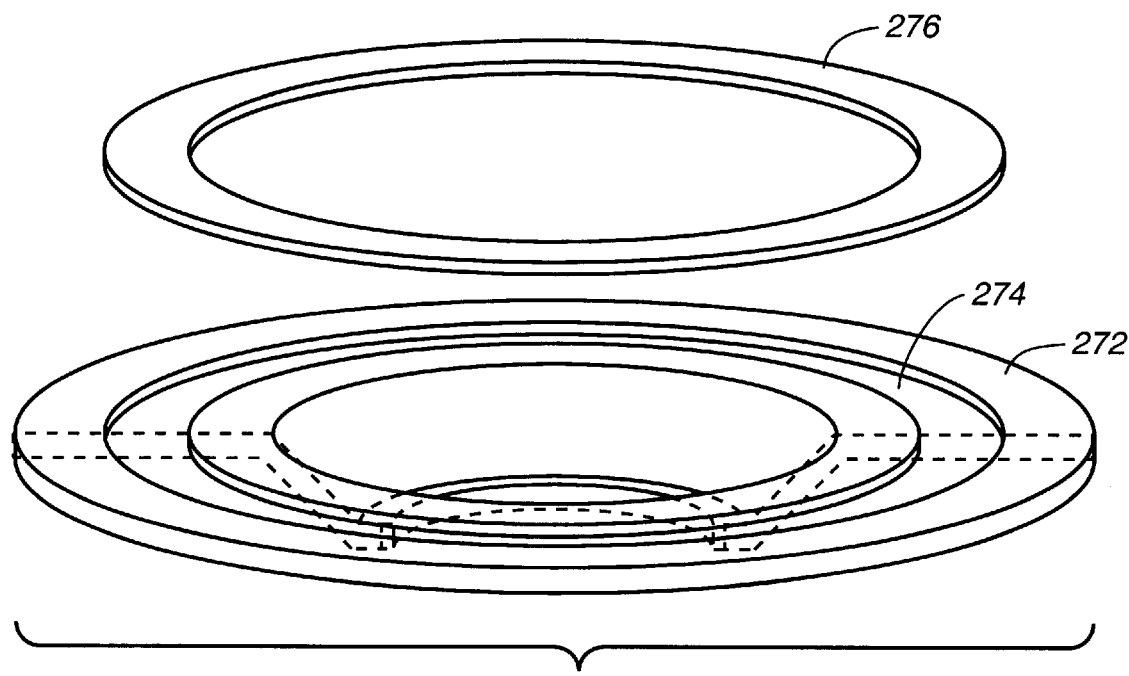
FIG._21

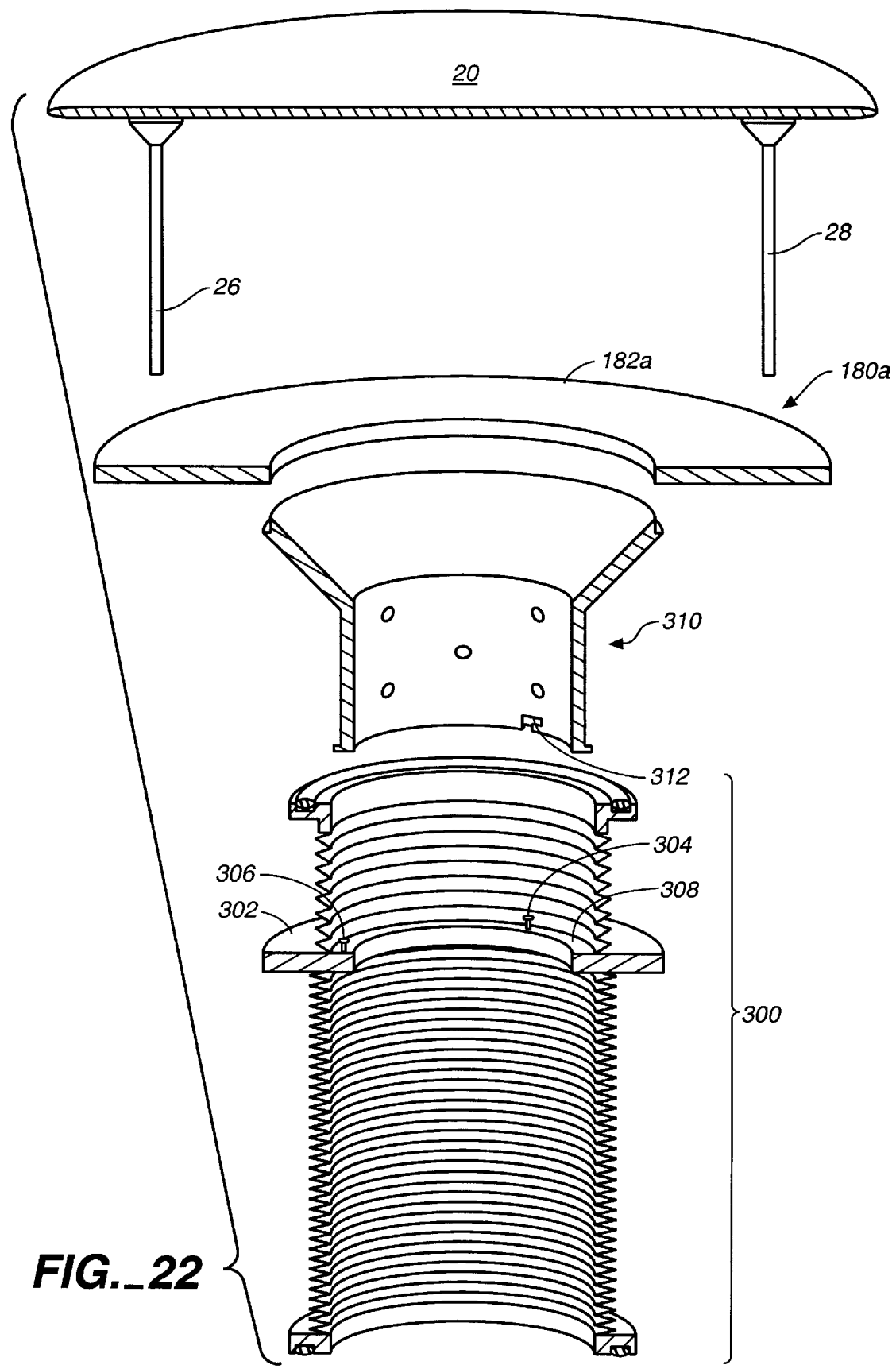
FIG._22

SELF-ALIGNING LIFT MECHANISM

This invention is a Continuation-in-part of U.S. patent application Ser. No. 08/738,240 filed on Oct. 25, 1996, inventors Leonid Selyutin and Jun Zhao, which is hereby incorporated by reference herein.

FIELD OF THE INVENTION

This invention relates to the structure and method of moving a substrate within a processing chamber. In particular the invention relates to the configuration of a lift-pin support structure in cooperation with the movement of a substrate support plate (pedestal) supported by a stem in the processing chamber.

BACKGROUND OF THE INVENTION

In the substrate processing chamber such as those shown in Zhao U.S. Pat. No. (5,558,717—CVD Processing Chamber) the movement of the substrate into and out of the chamber for processing includes a series of several motions. One of the motions is to raise and lower the pedestal/heater with attached stem. During this motion the substrate is raised above the pedestal surface using lift pins, so that a robot blade can insert and remove substrates from the processing chamber as substrates are moved to and from the processing location within the processing chamber. Larger and larger substrates are being processed and various lift mechanisms to support those substrates and move them to their processing locations are known in the prior art. An example of such a lift mechanism is pictured in U.S. Pat. No. 5,558,717 (which is expressly incorporated herein by reference). The use of larger substrates, requires an increase in the size of the substrate support plates, and when those support plates are supported by stems, use of larger stems to assure that the substrate moves uniformly and consistently in the transfer of the substrate to and from its processing location in the processing chamber. An example of the kind of lift mechanism used in processing chambers is shown in U.S. Pat. No. 5,558,717 and the improvements as shown in U.S. patent application Ser. No. 08/738,240 filed on Oct. 25, 1996.

The lift mechanism as described in the above-referenced documents, has a single motor driving a stem/lower carrier which is attached to the end of the stem of the substrate support plate (pedestal or heater) to move the substrate support plate up and down. A series of springs, linkages, structural members, and an intermediate carrier mounted on a bearing rail interact with the lower carrier and other parts of the lift mechanism to raise and lower lift pins which raise and lower the substrate during the transfer of the substrate into and out of the processing chamber and to and from the processing location in the processing chamber.

A detailed understanding of the interaction between the elements of the linkage can be gained by reviewing FIGS. 1–7 which show in a cross-sectional schematic form the movement of the linkage from an initial location where a substrate 20 is held raised on a series of lift pins (26, 28) above the top 24 of a subtrate support plate 22. The substrate support plate 22 is integrally connected with a substrate support plate stem 30 which can be hollow or solid, although utility feed connections such as power and cooling when used are routed through the stem whether it is hollow or solid. A bottom end connector 34 is fixed to, supports, and is sealed to the end of the stem 30 (the sealing between the stem 30 and the end connector 34 is not shown here). The bottom end connector 34 is fixed to a driven carrier (not shown in FIG. 1) which moves up and down and slides along the rail of a linear bearing which is parallel to the longitudinal axis of the substrate support plate stem 30. When the stem bottom end connector 34 is driven vertically either up or down by a drive mechanism connected to a drive motor (both of which are not shown) the substrate support plate 22 moves up and down. A floating carrier member 36 (only part of which is shown in FIG. 1) is also connected to the same vertical linear bearing rail along which the bottom end connector 34 and associated lower carrier move vertically.

The floating carrier member 36 is fixed to an upper lift pin support tube-cone 40. A separate perspective cross-sectional view of the lift pin support structure around the stem 30 is shown in FIGS. 8 and 9. FIG. 8 shows an assembled perspective cross sectional view of the inside of the lift pin support structure, while FIG. 9 is a partially exploded view of the components of FIG. 8.

The lift pin support structure consists of the upper lift pin support tube-cone 40 which has a cone section 44 having a lift plate support notch 46. The lift plate support notch 46 mates with an inner edge 86 of the annual lift pin ring to support the annular lift pin ring plate 84. The connection between the cone section 44 of the upper lift pin support tube-cone 40 may be a slip fit or may be a twist interlock type mating arrangement. The upper lift pin support tube-cone 40 has a lower outer segmented flange 42 which mates with series of bottom flange inward projections 58 located on a lower flange 54 of the upper bellows 48. While not shown in the schematic figures, a flange bolt pattern located at the outside edge of the lower flange 54 of the upper bellows causes the bottom flange inward projections 58 to capture the external segmented flange projections 42 of the upper lift pin support tube-cone 40 and tightly clamp the end of the tube to the top of the floating carrier member 36. The O-rings 56 in the lower flange 54 provide a gas-tight seal between the bellows 48 and the floating carrier member 36.

Attached to the bottom of the floating carrier member 36 is a lower bellows 70. The lower bellows 70 has a lower flange 78 with an O-ring configuration 80. The upper flange 72 of the lower bellows has an O-ring assembly 74. The upper flange 72 of the lower bellows includes a flange shelf 76 which captures and clamps a catch tube top flange 64. The catch tube top flange 64 is clamped against the bottom of the floating carrier member 36 by a bolt pattern (not shown) clamping the outside edge of the upper flange 72 of the lower bellows to the floating carrier member 36.

The catch tube 62 includes a catch flange 66 which is an internal flange extending towards the central axis of the lift mechanism. As can be seen in FIG. 1, the upper flange 50 of the upper bellows 48 is clamped through an O-ring sealing 52 configuration to a lift mechanism support frame 110 which is sealed to the bottom of the substrate processing chamber 38. The wall of the processing chamber and the lift mechanism support frame are generally liquid cooled so that the O-ring 52 of the upper flange 50 experiences a temperature no greater than that of the liquid cooled lift mechanism support frame 110. The lower flange 78 of the lower bellows 70 is sealed to the bottom end connector 34 which is integral or fixed to the driven carrier member (not shown). The vacuum limits of the processing chamber are established by a series of seals. The seals are: between the lift mechanism support frame 110 and the bottom of the processing chamber 38, an O-ring seal between the upper flange 50 of the upper bellows 48 and the bottom chamber 38, an O-ring seal between the upper flange 50 of the upper bellows 48 and the bottom of the lift mechanism support frame 110, and O-ring seal between the lower flange 54 of the upper bellows and the top surface of the floating carrier member 36, an O-ring seal sealing the upper flange 72 of the lower bellows 70 to the bottom of the floating carrier member 36, and an O-ring seal sealing the lower flange 78 of the lower bellows to the bottom end connector 34.

In the configuration as shown in FIG. 1 a series of horizontal dashed reference lines are provided to make the comparison between the adjacent figures and the relative motion between the lift elements easily detectable and apparent. The dashed reference line 90 references the bottom of the bottom end of the bottom end connector, the dashed reference line 92 references the top of the floating carrier at its lowest position, the dashed reference line 94 references the top of the lift pin ring at its lowest position, the dashed reference line 96 references the top of the substrate support at its lowest position, and dashed reference line 98 references the top of the substrate support plate in its highest position.

During normal operation, the vacuum in the processing chamber creates an inward force on all outside surfaces of the chamber and also generally tends to cause the substrate support plate 22 and its stem 30 to move inward/upward. The end of the stem 30 and the bottom end connector 34 are fixed to a lower/driven carrier member (not shown) by a tight connection which prevents the substrate support plate 22 and its stem 30 from moving upwards.

As shown in FIG. 1, a substrate 20 is supported on a set of lift pins (26, 28) (usually a set of three or four lift pins is common) above the top surface 24 of the substrate support plate 22. The distance between the substrate 20 and the top 24 of the substrate support plate 22 allows a robot plate to be inserted under the substrate for transporting it into and out of the processing chamber 38. The intermediate/floating carrier member 36 is attached to a vertical track to move vertically up and down easily depending of the movement of the bottom end connector 34 which is attached to the lower carrier which also moves up and down along the same linear bearing track as the floating carrier member 36. The lift pins 26, 28 having enlarged top ends (for example, conically shaped) to prevent their falling through the substrate support plate 22. The lift pins 26, 28 are supported at their lower end by a lift pin support structure. The lift pin support structure consists of a lift pin ring plate 84 which is supported by an upper lift pin support tube-cone 40 which in turn is supported by the floating carrier member 36 and which supports the catch tube 62.

As the lift pins 26, 28 mover relative to the substrate support plate 22, the lift pins raise and lower the substrate from the top surface 24 of the substrate support plate 22. A description of the movement of these pieces which cause the lift pins 26, 28 to move relative to the substrate support plate 22 is discussed with progressive movements from the configuration as shown in FIG. 1 at its lowest position to the highest position of the substrate as shown in FIG. 4, the substrate processing position, and then progressive steps for lowering and removal of the substrate progressively until the lowest position is shown again in FIG. 7.

In FIG. 1 the substrate 20 is supported by a series of lift pins (e.g., 26, 28) which rest on the top of the annular lift pin ring plate 84. The lift pin ring plate is supported through the upper lift pin support tube-cone 40 by the floating carrier member 36 to which the catch tube 62 is clamped. The floating carrier member 36 can move freely along its longitudinal vertical axis which is collinear with the center of the processing chamber. However its vertical movement is restricted by a vertical spring force generated by a preload spring 116 of which there may be several equally distributed around the longitudinal vertical axis. The preload spring 116 is supported by a preload spring support member 114 fixed to the lift mechanism support frame 110. The preload spring 116 urges the floating carrier member 36 upwardly. However the upward movement of the floating carrier member 36 is restricted by the catch flange 66 of the catch tube 62 which moves into interference with a stem intermediate flange 31 of the substrate support plate stem 30. Thus the upward movement of the lift pin support structure can be no higher than the lowest position of the stem intermediate flange 31. In this position the lift pins 26, 28 are supported on the annular lift pin ring plate 84 and the extend through the substrate support plate 22 to support the substrate 20 above the top 24 of the substrate support plate 22.

Movement of the components into the position as shown in FIG. 2 shows that movement of each of the components as shown by arrows 120, 122, 124, 126, and 128 shows that the bottom end connector being driven by a driven carrier (not shown) has caused each component as shown in FIG. 1 to rise an equal amount with respect to the reference positions of FIG. 1 with respect to the processing chamber 38. At the position as shown in FIG. 2, the upward movement of the floating carrier member 36 causes the upper bellows 48 to be compressed until an adjustable hard stop 112 is contacted by the floating carrier member 36. FIG. 3 shows the continued progression of the raising of the bottom end connector 34. Arrows 130, 136 show the continued movement of the substrate support plate 22 vertically. The stop arrows 132, 134 show that the floating carrier member 36 is prevented from moving upwards by the adjustable hard stop 112 as a result the stem intermediate flange 31 separates and moves upwardly from the catch flange 66 of the catch tube 62. As this upward movement occurs, the lower bellows 70 become compressed. As a result of the continued rise of the substrate support plate 22, the lift pins 26, 28 which have remained stationary no longer extend above the top 24 of the substrate support plate 22 but have their upper enlarged end (for example, conically shaped) descend into the lift pin upper recesses (e.g. 27, 29 as shown in FIG. 1) such that the substrate 20 is now supported on the top surface 24 of the substrate support plate 22, thus making the distance between the substrate and substrate support plate very small, if not zero.

A further incremental movement of the configuration is seen in FIG. 4. Since the upward movement of the lift pin support structure has been stopped by the hard stop 112 interfering with the movement of the floating carrier member 36, the carrier member 36 and the annular lift pin ring plate 84 cannot move vertically as is shown by arrows 132 and 134. The continued vertical movement of the bottom end connector 34 as shown by arrows 138 and 140 cause the substrate support plate 22 to raise the lift pins 26, 28 such that they hang from the substrate support plate 22 while the top surface 24 of the substrate support plate 22 has reached its uppermost position as designated by the dashed reference line 98. The substrate 20 is now in position for processing.

A reverse progression of the step which took place in FIGS. 1–4 are shown in FIGS. 4–7.

As can be seen in FIG. 5, the downwardly facing arrows 146, 148, 150, 152 show the motion of the bottom connector downward to bring the bottom end of the lift pins 26, 28 in contact with the top of the annular lift pin ring plate 84. The floating carrier member 36 and the annular lift pin ring plate 84 remain stationary as shown by arrows 132, 134. Further progression of the bottom end connector shows that the lift pins 26, 28 now extend now through the substrate support plate 22 to lift the substrate 20 above the top of the substrate support plate 22. The arrows 154, 156 represent the downward movement of the support plate assembly.

In FIG. 6, the engagement and/or interference between the stem intermediate flange 31 and the catch flange 66 of the catch tube 62 is just reestablished.

In FIG. 7, the further downward movement of all of the members as shown by the arrows 158, 160, 162, 164, 166, as initiated by the bottom end connector 34, which is fixedly connected to the single vertical driven member the driven carrier (not shown here).

Some drawbacks associated with the configuration as described above include gas leakage at the O-rings sealed to the floating carrier member 36. In a normal processing environment, processing temperatures of up to 450° C. are common. Higher temperatures (as high as 750° C.) may be present in other processes, which will accentuate the thermal endurance problems. The upper end of the lift mechanism, e.g. the lift mechanism support frame 110, is liquid cooled. Such cooling also cools of the upper flange 50 of the upper bellows and prevents distortion of the joint and leakage through the O-ring that is contained therein. Similarly, the O-ring seal at the bottom flange 78 of the lower bellows 70 is positioned a large distance from the source of the process heat, such that the low and slow gradual heat rise to a relatively modest temperatures takes place at the bottom end of the lift mechanism. However, at the central location of the floating carrier member 36, the conduction of the thermal energy to the carrier flange as a result of exposure to the lift pin support tube which is within the processing chamber and generally subject to the high temperatures of the processing environment, can cause the temperature of the floating carrier member to increase such that the efficiency of the O-ring seals adjacent to the carrier member 36 deteriorate or fail. The stainless steel of the bellows is a poor thermal conductor and as a result cannot be used as a path to transfer heat.

Another disadvantage of the arrangement as discussed above is the requirement that the upper lift pin support tube-cone must be clamped to the floating carrier member 36 in a sufficiently tight configuration that the repeatable movement of the lift pins is assured. This necessitates a great deal of care in the assembly of the lift pin structure as shown in FIGS. 8 and 9 to assure that correct alignment is achieved. Further, because there are no keying (circularly referencing) elements between the bellows inner flange with the protrusions 58 and the mating lower outer flange segments 42 (which also has teeth) of the upper lift pin support tube-cone and the sliding and/or twist lock feature of the connection between the annular lift pin ring plate 84 and the lift plate support notch 46 of the cone section 44, a precise circular position orientation of the annular lift pin ring plate 84 cannot be assured. The stacking of tolerances of adjacent pieces causes the end result to be uncertain as it is not known if the tolerances average or stack to a minimum or maximum extreme.

A drawback of the inability to align the annular lift pin ring plate to the corresponding location of the lift pins requires a mechanism (to reduce the particles generated by the contact between the end of the lift pins and the top of the annular lift pin ring plate) to accommodate any random orientation. The orientation cannot be localized just to the area in which the lift pin is expected to contact the annular lift pin ring plate.

A further disadvantage of a configuration as described above concerns the wasted space inside the bellows which is needed to permit the interaction between the stem intermediate flange 31 and the catch flange 66 of the catch tube 62. This catching arrangement reduces the space that can be utilized by the diameter of the stem of a substrate support plate. This configuration also provides a tight clearance between adjacent pieces, such that during assembly the likelihood that one would rub against the other and be scratched to create particles in the processing chamber is increased. Twisting of one part against another can create particles.

Another drawback of the current configuration is that it requires that the lift mechanism be installed from outside the processing chamber while the substrate support plate or heater be installed from the inside of the support plate requiring detailed alignment and assembly at the location of the processing chamber each and every time that the lift mechanism must be disassembled or that a leak is detected.

Another disadvantage of the configuration as discussed above is that in the instance when the substrates catastrophically fail and are scattered throughout the processing chamber in the configuration as shown in FIGS. 1–9, the cone section 44 of the upper lift pin support tube-cone 40 prevents linear access to the inside of the upper bellows between the upper lift pin support tube-cone and the bellows to blow out or vacuum out dust particles or other particles which might have settled there.

SUMMARY OF THE INVENTION

In a configuration according to the present invention the disadvantages as discussed above are overcome by providing a welded connection at a central flange between two bellows to which a lift pin support tube has been internally welded such that a fully gas tight connection without O-rings is established at the bellows central flange. The bellows central flange corresponds and is fixed to the equivalent of a floating carrier member as described above. Since the bellows flange pieces are welded to the lift tube member, precisely defined reference orientations can be achieved by the use of screw holes located at the end of the lift tube to precisely locate the lift pin support structure including, for example a lift pin support plate. Tolerance stacking between adjacent pieces is also avoided.

The use of a lift tube to a dual bellows central flange welded connection is enhanced by the use of a catch member outside the vacuum limits of the processing chamber, which thereby reduces the particles generation due to the impact between adjacent parts. In one configuration, the driven carrier member is connected to the carrier member through a shoulder bolt which prevents the two carrier members from separating more than a fixed distance while allowing the two carrier members to slide easily toward one another along the bolt axis. The location of the catch member in close proximity to the adjacent bellows which establishes the vacuum limits of the processing chamber and the linear bearing guiding the driven and floating carrier members provides a larger diameter inside the bellows that may be used to increase the size of the stem of the substrate support to improve its rigidity or increase the size of its hollow center to provide additional instrumentation and control devices. The catch members are located adjacent to the linear bearings supporting the mechanism such that very little if any bending (tilt) of the carrier member results from the force of the catch members.

The lift pin support plate, since it can now be precisely oriented, can include ceramic inserts either one separately for each location at which the lift pin is expect to contact the support plate or an annular ring to eliminate the chance that the plate could be installed incorrectly.

A configuration is provided showing a larger process chamber opening so the lift mechanism could be attached as a single unit from the outside without having to assemble the substrate support plate (heater) from the inside of the processing chamber.

BRIEF DESCRIPTION OF THE DRAWINGS

FIG. 1 shows a schematic cross-sectional view of a lift mechanism and processing chamber utilizing two bellows which are sealed by O-rings to a floating carrier member. The bottom end connector which is attached to the lift drive is at its lowest position;

FIGS. 2, 3, and 4 show progressive movement of the lift mechanism as shown in FIG. 1 to a highest position as shown in FIG. 4;

FIGS. 5, 6, and 7 again show progressive incremental steps of the substrate lift mechanism as the mechanism is lowered from its highest position to its lowest position;

FIG. 8 shows a perspective cross-sectional view of the lift pin support structure in the configuration as shown in FIG. 1;

FIG. 9 shows an exploded view of a portion of a lift pin support structure as shown in FIG. 8, such that the separate pieces and their interrelationships and the sealing between them can be viewed and understood;

FIG. 10 shows a processing chamber utilizing a configuration according to the invention providing a central flange to which a top and bottom sets of bellows are welded along with an internal lift tube, an outside catch is provided between the floating carrier member and the drive carrier member;

FIGS. 11, 12, and 13 show progressive steps of the driven carrier member being raised to its highest position and the effects on the substrate and substrate position lift pins within the processing chamber;

FIGS. 14, 15, and 16 show a schematic cross-sectional view of the configuration as shown in 10, being lowered from its upper most position to its starting position as shown in FIG. 10;

FIG. 17 shows an alternate arrangement according to the invention providing a one-piece removal and reinstallation lift mechanism substrate support plate assembly and its incorporation into a processing chamber;

FIG. 18 shows a cross-sectional perspective view of the lift pin support structure as shown in the configuration of FIG. 11 with certain pieces separated for clarity. The dual bellows in this instance are one piece welded to the central flange to which the inner tube is also welded;

FIG. 19 is a perspective view of a floating carrier member and a driven carrier member in a configuration according to the present invention in the context of prior applications as earlier referenced;

FIG. 20 is a perspective view of an annular lift pin ring plate having four separate inserts locations;

FIG. 21 is an annular lift pin ring plate having a single annular insert ring; and FIG. 22 is an alternate arrangement using a twist lock connection between the bellows central flange and the lift pin plate support tube.

DETAILED DESCRIPTION

Following from the description in the Background of the Invention above which utilizes the information and data from the prior applications as referenced above, an overview of the configuration according to the invention can be understood by viewing FIGS. 10, 18 and 19 in relation to one another. A substrate 20 to be processed is contained within the processing chamber 38 which is supported on top 24 of the substrate support plate 22 which is supported exclusively by a stem 30 extending and sealed to the end connection member 238 which is fixed to the lower/driven carrier 239.

The "driven/carrier member" may include the lower driven carrier 38 and any members fixed to it. Similar to the earlier described configuration, a series of lift pins 26, 28 support the substrate 20. The lift pins are supported on a lift pin support plate 180. In the present configuration as seen in FIG. 18, a lift pin support plate 180 includes an annular portion 182 and a conical portion 184 with a flange at the inner end of the conical portion 184 containing a series of screw holes, e.g. 186, 188, to connect by screws (not shown) to screw holes 212, 214 in the lift pin support tube 208 of the bellows unit 200. The bellows unit 200 includes a lower flange 206 including an O-ring seal there, a lower bellows section 224, a central flange 202 which is welded to the lower bellows section and an upper bellows section 222 which is also welded to the central flange 202. The upper bellows section 222 is connected to an upper flange 204 also containing an O-ring seal configuration. A lift pin plate support tube 208 inside the upper bellows section 222 is welded to the inside of the central flange 202 and maintains a particular and specific orientation with respect to the central flange 202. While a bolt hole pattern in the central flange is not shown, certainly a bolt pattern with a particular orientation and specific reference points can be provided such that the lift pin plate support tube 208 and the screw holes 212, 214 at its upper end can be precisely located according to reference locations.

Rather than the external floating carrier 234 being sandwiched into the lift mechanism, a floating carrier 234 is bolted to the central flange 202 of the bellows unit 200. In this configuration the lift pin support tube 208 moves vertically in concert with the floating carrier 234. The floating carrier 234 rides on the rails of a linear bearing 232 which is fixed to a vertical support member 230. The lower carrier member 238 also rides on the bearing rail 232 and in a configuration according to the invention includes a passage (bolt receiving opening) 242 to receive a shoulder bolt 236. The shoulder bolt having threads 244 at its end is threaded tightly into a threaded opening in the floating carrier 234. The bolt receiving opening 242 in the lower/driven carrier 238 includes a bore shoulder 248 which prevents the head 240 of the shoulder bolt from moving beyond the bore shoulder. The close proximity of the catch bolt member to the bearing surface minimizes the tilt (bending) of the carrier member when the catch force becomes applied. The hard stop 112a in this configuration is created by at least one horizontally oriented bolt which is disposed adjacent to the bearing track on which the carriers ride.

The movement and interaction of the various pieces can be observed in the progressive movement as shown as the lower/driven carrier moves upwards as pictured in a progression in FIGS. 10 to 11 to 12 to reach a high point at FIG. 13 and then again to move progressively downward in FIGS. 14, 15 and 16.

FIG. 11 shows an incremental movement from the configuration as shown in FIG. 10 this movement is similar to the configuration of FIG. 2. All of the moveable members move up with the lower/driven carrier 238.

In FIG. 12 the floating carrier 234 again is stopped by the adjustable hard stop 112a while the lower/drive carrier 238 moves upwards and the progression for FIGS. 12 to 16 is same as shown in FIGS. 3, 4, 5, 6 and 7.

As can be seen in FIG. 18, an access gap 220 exists between the lift pin plate support tube 208 and the inside of the upper bellows section 222. This can be cleaned by blowing out or vacuuming out particles which have fallen therein and can also be viewed by removing the lift pin support plate 180 whose conical section is removed with the flat plate and does not remain connected to the vertical tube.

FIG. 17 shows an alternate configuration according to the invention wherein a process chamber 280 has a large lower opening 252 which is spanned by an alternate support frame 250 of a packaged lift mechanism including the substrate support plate (heater/pedestal). In this configuration the lift mechanism and heater/support plate can be installed as a single unit and once a seal is made at the perimeter, no further adjustments are required.

FIG. 20 shows an alternative arrangement of a lift pin support plate with four insert openings. Four recesses 262, 264, 266, 268 can be provided into which a small (0.5–1 inch diameter) ceramic disk 270 can be inserted, the location of the disk to be positioned at the location where the bottom of the lift pin contacts the lift pin support plate when the lift pin support structure is raised.

FIG. 21 provides an alternative arrangement of a lift pin support plate with an annular insert track having an annular recess 274 to receive an insert 276 which again is made of a ceramic material. Use of such a ceramic reduces the probability that particles would be generated as a result of the contact/impact between the end of the lift pins and the top of the lift pin support plates.

FIG. 22 shows an alternate arrangement according to the invention. A bellows 300 having a central flange 302 equipped with a series of enlarged head protrusions (shaped in the form of bolt heads) 304, 306 are provided to mate with twist lock receiving openings, e.g., 312, of the lift pin support tube 310. In this arrangement the support tube can easily be completely removed from the bellows by twisting, so that the whole of the inside of the bellows is available for cleaning (for example above the ledge 308 supporting the bolt head like protrusions, the ledge 308 extending beyond the bellows flutes toward the center of the bellows). An actual bolt or screw head may be used or the similar feature may be provided integral with the central flange material during manufacture.

While the invention has been described with regards to specific embodiments those skilled in the art will recognize that changes can be made in the form and detail without departing from the spirit and scope of the invention.

What is claimed is:

1. A substrate processing apparatus comprising:
    a substrate support plate having a stem supported by a driven carrier member,
    a series of lift pins which when configured in a raised position support a substrate separated from said substrate support plate at first position at a first distance from said substrate support plate, said series of lift pins when configured in a lowered position cause the substrate to be supported in a second position at a second distance from said substrate support plate, said second distance being less than said first distance;
    a lift pin support structure configured to contact said series of lift pins to cause said series of lift pins to move from said lowered position to said raised position and support said series of pins in said raised position, said lift pin support structure being fixed to a floating carrier member, and
    a catch member fixed to said floating carrier member, said catch member being configured to allow said floating carrier member to move relative to said driven carrier member when said floating carrier member and said driven carrier member are less than a catch distance apart, said catch member being configured to prevent said floating carrier member and said driven carrier member from separating from each other greater than a catch distance;
    wherein said substrate is processed in a vacuum processing chamber and said catch member is located outside a vacuum limit of said processing chamber.

2. The substrate processing apparatus as in claim 1, wherein the lift pin support structure includes a bellows central flange between two elastic bellows sections, the elastic bellows sections being welded in a gas tight connection to said central flange.

3. The substrate processing apparatus as in claim 2, wherein a lift pin structure support tube is fixed to the bellows central flange.

4. The substrate processing apparatus as in claim 2, where the lift pin support structure tube is welded to the bellows central flange.

5. The substrate processing apparatus as in claim 1, where a lift pin plate which is part of said lift pin support structure is attached to the rest of said lift pin support structure tube through a screw connection.

6. The substrate processing apparatus as in claim 1, where lift pin plate is attached to said lift pin support tube through a twist lock connection.

7. The substrate processing apparatus as in claims 5 or 6, where space between the bellows and the lift pin support structure tube is linearly accessible upon removal of said lift pin plate.

8. A substrate processing apparatus comprising:
    a substrate support plate having a stem supported by a driven carrier member,
    a series of lift pins which when configured in a raised position support a substrate separated from said substrate support plate at first position at a first distance from said substrate support plate, said series of lift pins when configured in a lowered position cause the substrate to be supported in a second position at a second distance from said substrate support plate, said second distance being less than said first distance; and
    a lift pin support structure configured to contact said series of lift pins to cause said series of lift pins to move from said lowered position to said raised position and support said series of pins in said raised position, said lift pin support structure being fixed to a floating carrier member,
    where an opening in the processing chamber through which the lift mechanism passes is larger than the diameter of the substrate support plate, such that the substrate lifting mechanism can be pre-assembled outside the processing chamber prior to being attached to the processing chamber as a unit.

9. A substrate processing apparatus comprising:
    a lift pin support plate of a lift pin support structure in a substrate processing chamber including a set of inserts specifically located in said lift pin support plate opposite ends of a series of lift pins, wherein a progressive movement to raise a substrate in said processing chamber causes said set of inserts to contact the ends of said series of lift pins to raise said series of lift pins.

10. A substrate processing apparatus comprising:

a lift pin support plate of a lift pin support structure in a substrate processing chamber including an annular insert specifically located in said lift pin support plate opposite ends of a series of lift pins, wherein a progressive movement to raise a substrate in said processing chamber causes said set of inserts to contact the ends of said series of lift pins to raise said series of lift pins.

* * * * *